(12) United States Patent
Iwase et al.

(10) Patent No.: US 12,730,176 B2
(45) Date of Patent: Sep. 8, 2026

(54) MEASUREMENT APPARATUS

(71) Applicant: ANRITSU CORPORATION, Kanagawa (JP)

(72) Inventors: Takashi Iwase, Kanagawa (JP); Yuki Kondo, Kanagawa (JP); Chunqing Liang, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 297 days.

(21) Appl. No.: 18/421,000

(22) Filed: Jan. 24, 2024

(65) Prior Publication Data

US 2024/0264262 A1 Aug. 8, 2024

(30) Foreign Application Priority Data

Feb. 3, 2023 (JP) ................................ 2023-015082

(51) Int. Cl.
*G01S 5/02* (2010.01)
*G01R 35/00* (2006.01)

(52) U.S. Cl.
CPC ........... *G01S 5/021* (2013.01); *G01R 35/005* (2013.01)

(58) Field of Classification Search
None
See application file for complete search history.

(56) References Cited

U.S. PATENT DOCUMENTS

2005/0206566 A1* 9/2005 Stilp ........................ G01S 5/06 342/455
2016/0183917 A1* 6/2016 Kameishi ................ A61B 8/54 600/437

FOREIGN PATENT DOCUMENTS

JP 6975207 B 12/2021

* cited by examiner

*Primary Examiner* — Frantz Bataille
(74) *Attorney, Agent, or Firm* — McDonald Hopkins LLC

(57) ABSTRACT

To provide a measurement apparatus capable of simplifying a test configuration and reducing cost. A measurement apparatus includes a measurement unit 2 that measures an RF signal received from a DUT 20, a signal generation unit 3 that generates and transmits a test RF signal to be transmitted to the DUT 20, and a 1-PPS signal generation unit 4 that generates a 1-PPS signal for synchronization of transmission/reception timing between the measurement unit 2, the signal generation unit 3, and the DUT 20, and outputs the generated 1-PPS signal to each of the measurement unit 2, the signal generation unit 3, and the DUT 20.

3 Claims, 4 Drawing Sheets

MEASUREMENT APPARATUS

TECHNICAL FIELD

The present invention relates to a measurement apparatus that measures a characteristic and a status of a received signal, and generates and transmits a signal for measuring a characteristic and a status of a reception process of a signal.

BACKGROUND ART

There is a measurement apparatus that measures a characteristic and a status of a radio signal transmitted from radio communication devices such as a chipset and a radio communication module compatible with cellular-vehicle to everything (C-V2X) standard as a device under test (DUT).

In such a measurement apparatus, in order to obtain an accurate measurement result, it is necessary that the DUT and the measurement apparatus are synchronized.

Patent Document 1 discloses that clocks of a DUT, that is a transmission source of a measurement target signal, and a signal measurement apparatus are synchronized by using a synchronization signal of the measurement target signal.

RELATED ART DOCUMENT

Patent Document

[Patent Document 1] Japanese Patent No. 6975207

DISCLOSURE OF THE INVENTION

Problem that the Invention is to Solve

Such clock signal synchronization has been performed by inputting a global positioning system (GPS) signal or a 1 pulse per second (PPS) signal to both the DUT and the signal measurement apparatus.

However, in general, a global navigation satellite system (GNSS) simulator is used to generate a GPS signal, and a function generator is used to generate a 1-PPS signal.

Since such devices are different from the DUT and the measurement apparatus, a test configuration is complicated, and it takes time and effort to construct the test configuration.

Since the GNSS simulator and the function generator are expensive, it takes cost to construct the test configuration.

Accordingly, an object of the present invention is to provide a measurement apparatus capable of simplifying a test configuration and reducing cost by generating a signal for synchronization in the apparatus.

Means for Solving the Problem

According to the present invention, there is provided a measurement apparatus that communicates with a radio communication device by synchronizing transmission and reception of radio signals by a common 1-PPS signal, measures a radio signal received from the radio communication device, and generates and transmits a measurement radio signal to the radio communication device. The measurement apparatus includes a 1-PPS signal generation unit that generates the 1-PPS signal and outputs the generated 1-PPS signal to an inside of the apparatus and the radio communication device.

With this configuration, a 1-PPS signal for synchronizing transmission and reception of radio signals is output to the inside of the apparatus and the radio communication device. Therefore, a device that generates the 1-PPS signal is not necessary, and thus it is possible to simplify a test configuration, and reduce cost.

Further, the measurement apparatus according to the present invention further includes a measurement unit that measures the radio signal received from the radio communication device, and a signal generation unit that generates a measurement radio signal. The 1-PPS signal generation unit separately outputs the 1-PPS signal to the measurement unit and the signal generation unit.

With this configuration, the 1-PPS signal is separately output to the measurement unit and the signal generation unit. Therefore, it is possible to cope with, for example, a test in which a timing of the 1-PPS signal output to the measurement unit and the signal generation unit is changed.

Further, in the measurement apparatus according to the present invention, the 1-PPS signal generation unit is configured to include a plurality of delay elements connected in series and a selector that selects and outputs one of outputs of the plurality of delay elements so as to be able to separately adjust a delay time of the 1-PPS signal output to each of the measurement unit, the signal generation unit, and the radio communication device.

With this configuration, the delay time of the 1-PPS signal output to each of the measurement unit, the signal generation unit, and the radio communication device is separately adjusted. Therefore, it is possible to cope with a test environment in which it is necessary to adjust the delay time of the 1-PPS signal output to each of the measurement unit, the signal generation unit, and the radio communication device.

Advantage of the Invention

The present invention can provide a measurement apparatus capable of simplifying a test configuration and reducing cost.

BEST MODE FOR CARRYING OUT THE INVENTION

Hereinafter, a measurement apparatus according to an embodiment of the present invention will be described in detail with reference to the drawings.

Figure 1:
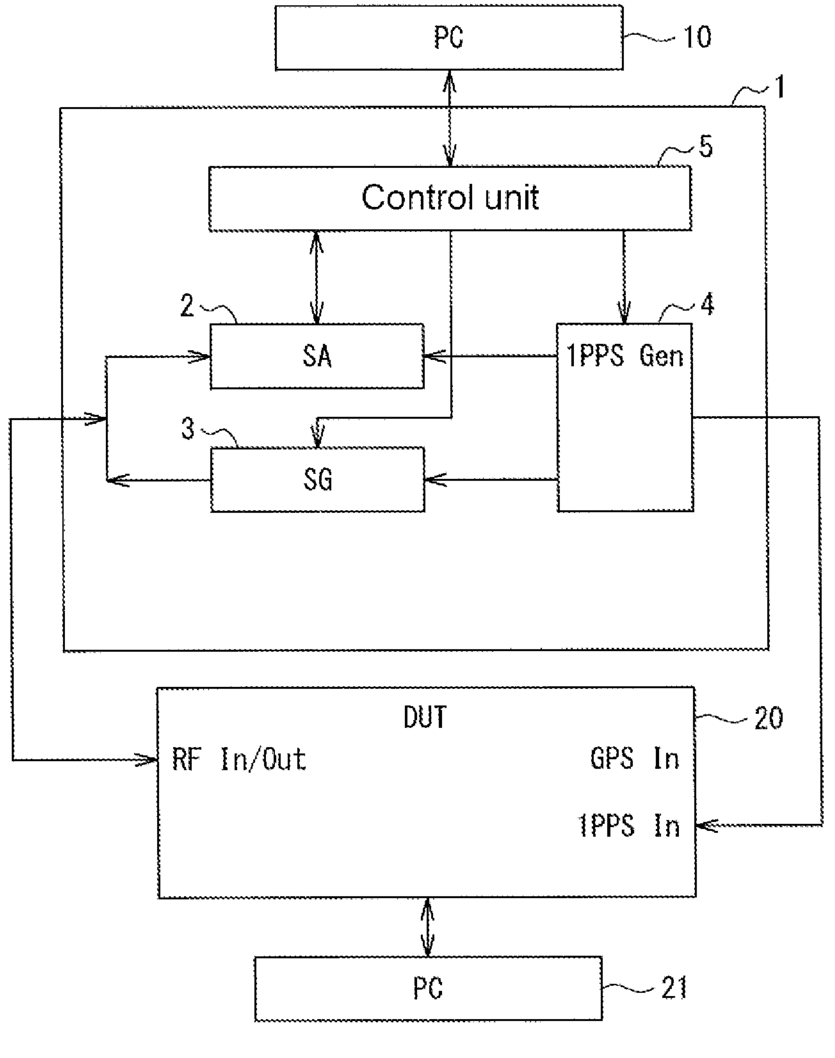
FIG. 1 is a schematic diagram illustrating a configuration of a measurement apparatus according to an embodiment of the present invention.

In FIG. 1, a measurement apparatus 1 according to the embodiment of the present invention transmits and receives an RF (radio frequency) signal to and from a DUT 20 that is a radio communication device, by a wire via a coaxial cable or the like. The measurement apparatus 1 and the DUT 20 may transmit and receive an RF signal by radio.

The measurement apparatus 1 includes a measurement unit 2, a signal generation unit 3, a 1-PPS signal generation unit 4, and a control unit 5.

The measurement unit 2 measures transmission power, transmission modulation accuracy, and the like of an RF signal received from the DUT 20 and outputs the measurement result to the control unit 5. The control unit 5 associates the measurement result from the measurement unit 2 with time information and the like, and transmits the result of the association to a measurement apparatus control personal computer (PC) 10.

The signal generation unit 3 generates a test RF signal to be transmitted to the DUT 20 and transmits the RF signal to the DUT 20.

The 1-PPS signal generation unit 4 generates a 1-PPS signal for synchronization of a transmission/reception timing between the measurement unit 2, the signal generation unit 3, and the DUT 20, and outputs the generated 1-PPS signal to the measurement unit 2, the signal generation unit 3, and the DUT 20.

Figure 2:
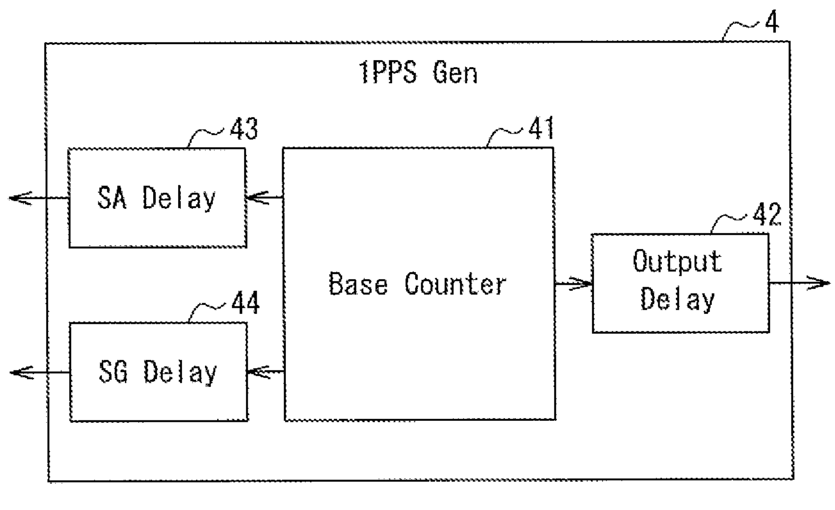
FIG. 2 is a diagram illustrating an example of a configuration of a 1-PPS signal generation unit in the measurement apparatus according to the embodiment of the present invention.

The 1-PPS signal generation unit 4 includes, for example, a base counter 41, an output delay unit 42, a delay unit 43 for the measurement unit, and a delay unit 44 for the generation unit, as illustrated in FIG. 2.

The base counter 41 is a counter that generates a reference 1-PPS signal. The output delay unit 42 adjusts the delay time of the 1-PPS signal to be output to the DUT 20. The delay unit 43 for the measurement unit adjusts the delay time of the 1-PPS signal to be output to the measurement unit 2. The delay unit 44 for the generation unit adjusts the delay time of the 1-PPS signal to be output to the signal generation unit 3.

Figure 3:
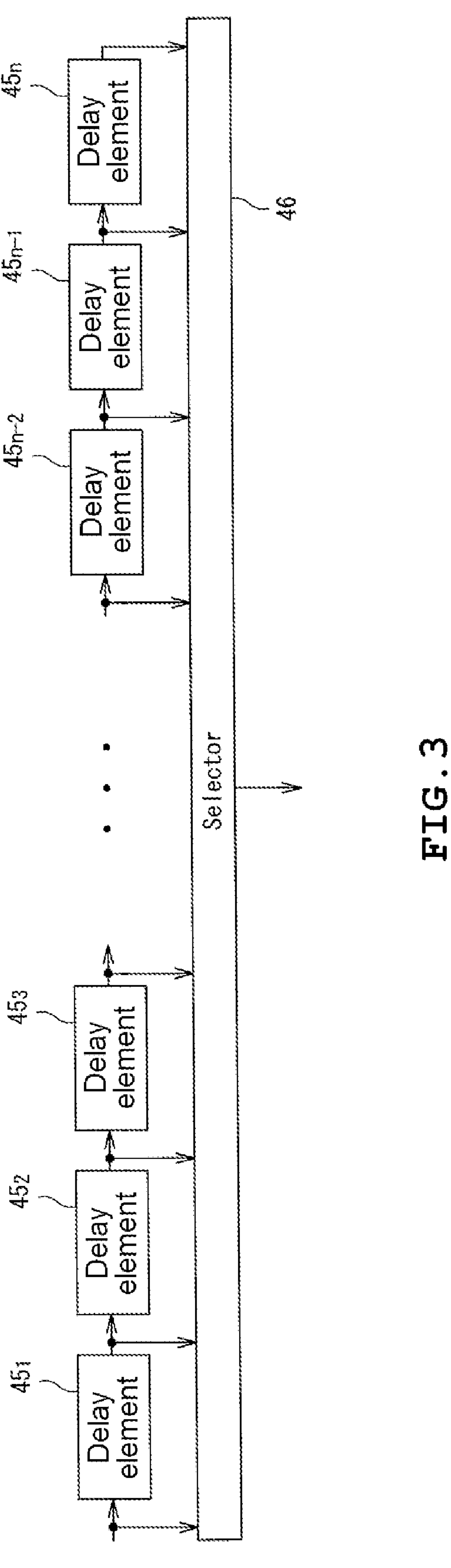
FIG. 3 is a diagram illustrating an example of a configuration of a delay processing unit in the measurement apparatus according to the embodiment of the present invention.

For example, as illustrated in FIG. 3, the output delay unit 42, the delay unit 43 for the measurement unit, and the delay unit 44 for the generation unit are configured to include a plurality of delay elements 45 ($45_1$, $45_2$, $45_3$, . . . , $45_{n-2}$, $45_{n-1}$, $45_n$) and a selector 46.

The delay element 45 delays the input signal by a predetermined time and outputs the delayed signal. The delay element 45 outputs the delayed signal to the next delay element 45 and the selector 46.

The selector 46 selects and outputs the signal input from any one of the plurality of delay elements $45_1$, $45_2$, $45_3$, . . . , $45_{n-2}$, $45_{n-1}$, and $45_n$. As described above, the output delay unit 42, the delay unit 43 for the measurement unit, and the delay unit 44 for the generation unit can output signals obtained in a manner that the input signals are delayed by a predetermined time by the selection of the selector 46.

Therefore, the 1-PPS signal generation unit 4 can separately adjust the delay times of the 1-PPS signals output to the measurement unit 2, the signal generation unit 3, and the DUT 20. For example, even when the measurement apparatus 1 and the DUT 20 are installed to be spaced from each other and it takes time for the 1-PPS signal output from the measurement apparatus 1 to reach the DUT 20, it is possible to cope with this case by adjusting the delay time.

In addition, it is possible to cope with a case where it is desired to shift the timing of the synchronization signal between the measurement unit 2, the signal generation unit 3, and the DUT 20, as a test condition. A configuration in which the delay is added by the counter may be made.

In FIG. 1, the control unit 5 is configured by a computer unit including a central processing unit (CPU), a read only memory (ROM), a random access memory (RAM), a non-volatile storage medium such as a hard disk device, and various input and output ports (not illustrated).

The ROM and the hard disk device of this computer unit store various control constants, various maps, and the like, as well as a program for causing the computer unit to function as the control unit 5. That is, the computer unit functions as the control unit 5 by the CPU executing the program stored in the ROM by using the RAM as a work region.

The control unit 5 is connected to the measurement apparatus control PC 10 via a network or the like. The measurement apparatus control PC 10 is configured by a personal computer including an input unit (not illustrated) configured by a keyboard, mouse, and the like, and a display unit (not illustrated) configured by a liquid crystal display and the like.

The control unit 5 is controlled by a control signal from a program operating on an operating system (OS) of the measurement apparatus control PC 10.

The measurement apparatus 1 may include an input unit and a display unit, and the control unit 5 may perform processing based on an input from the input unit.

The DUT 20 is, for example, a test board on which a radio communication device such as a chipset and a radio communication module compatible with the C-V2X standard is mounted. The DUT 20 is connected to a DUT control PC 21 via a network or the like.

The DUT control PC 21 is configured by a personal computer including an input unit (not illustrated) configured by a keyboard, mouse, and the like, and a display unit (not illustrated) configured by a liquid crystal display and the like.

The DUT 20 is controlled by a control signal from a program operating on an OS of the DUT control PC 21.

The measurement apparatus control PC 10 and the DUT control PC 21 may use one personal computer.

Figure 4:
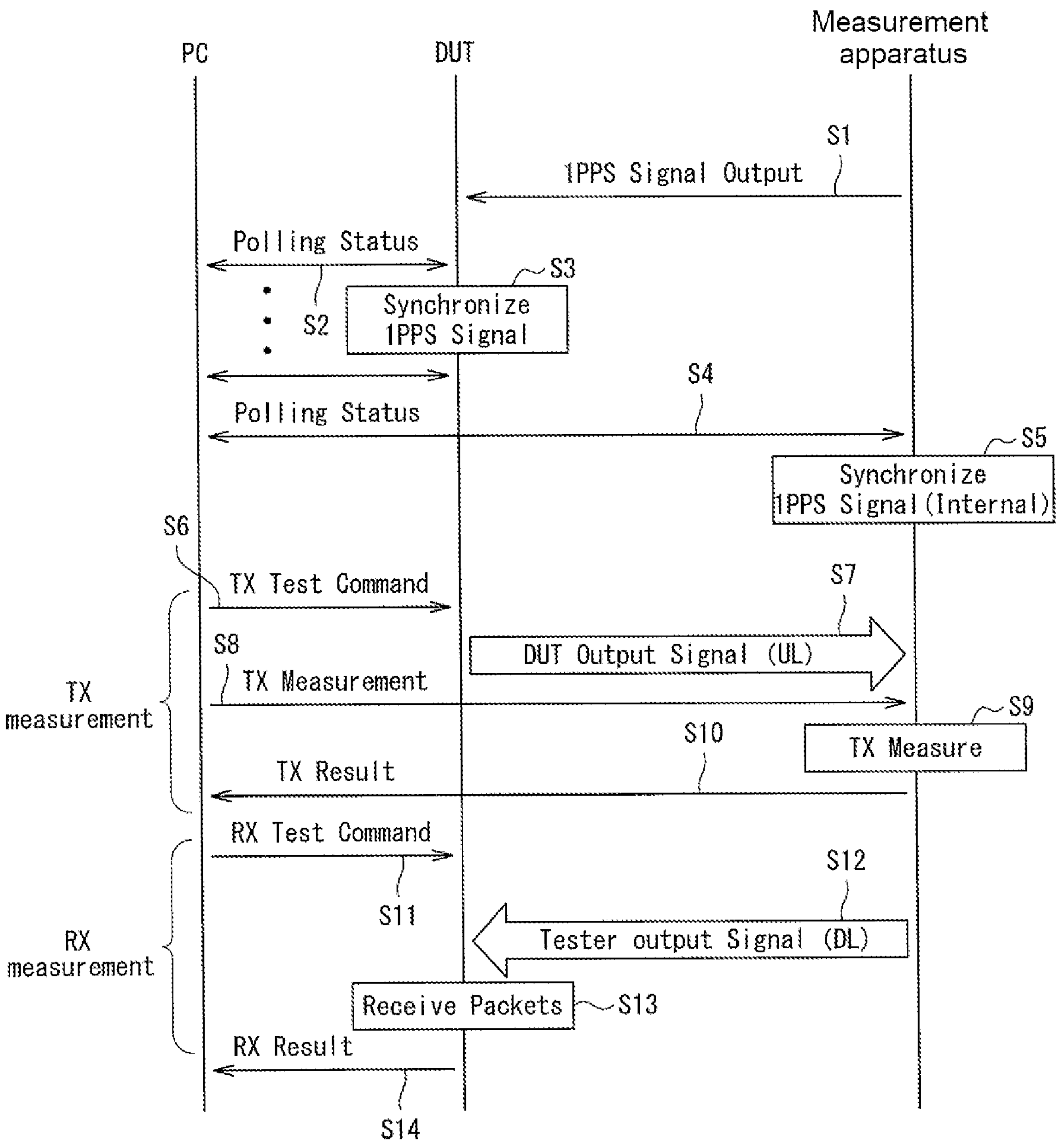
FIG. 4 is a sequence diagram illustrating an example of a test procedure of the measurement apparatus according to the embodiment of the present invention.

An example of a test procedure by the measurement apparatus 1 according to the present embodiment configured as described above will be described with reference to the sequence diagram of FIG. 4. FIG. 4 illustrates a case where the measurement apparatus control PC 10 and the DUT control PC 21 are configured by one personal computer, and a personal computer having the functions of both the measurement apparatus control PC 10 and the DUT control PC 21 is denoted by "PC".

In Step S1, when a 1-PPS signal is output by operating the measurement apparatus 1, the control unit 5 of the measurement apparatus 1 causes the 1-PPS signal generation unit 4 to output the 1-PPS signal, and thus the 1-PPS signal is output to the DUT 20.

In Step S2, when acquisition of the GPS signal is selected by operating the PC as the DUT control PC 21, the PC as the DUT control PC 21 transmits "Polling Status" to the DUT 20, and then waits until the DUT 20 turns into a synchronization completion state.

In Step S3, when the DUT 20 receives "Polling Status" from the PC as the DUT control PC 21, the DUT 20 starts synchronization with the 1-PPS signal input from the measurement apparatus 1, and transmits the result when the synchronization has been completed, to the PC.

In Step S4, when synchronization of the measurement apparatus is selected by operating the PC as the measurement apparatus control PC 10, the PC as the measurement apparatus control PC 10 transmits "Polling Status" to the measurement apparatus 1. Then, the measurement apparatus control PC 10 waits until the measurement apparatus 1 turns into the synchronization completion state.

In Step S5, the control unit 5 of the measurement apparatus 1 causes the measurement unit 2 and the signal generation unit 3 to be internally synchronized with each other by the 1-PPS signal generated by the 1-PPS signal generation unit 4. Then, the control unit 5 transmits the result when the synchronization has been completed, to the PC. Here, since the synchronization is performed internally, the synchronization is completed immediately.

Thereafter, in Step S6, when the PC as the DUT control PC 21 determines that the synchronization with the 1-PPS signal input from the measurement apparatus 1 has been completed in the DUT 20, the DUT control PC 21 transmits "TX Test Command" to the DUT 20.

In Step S7, when the DUT 20 receives "TX Test Command" from the DUT control PC 21, the DUT 20 transmits a predetermined RF signal to the measurement apparatus 1.

In Step S8, when the measurement of a transmission signal is selected by operating the PC as the measurement apparatus control PC 10, the PC as the measurement apparatus control PC 10 transmits "TX Measurement" to the measurement apparatus 1.

In Step S9, when the control unit 5 of the measurement apparatus 1 receives "TX Measurement" from the PC as the measurement apparatus control PC 10, the control unit 5 causes the measurement unit 2 to measure a reception signal.

In Step S10, when the measurement of the reception signal is ended, the control unit 5 of the measurement apparatus 1 transmits the measurement result of the reception signal to the PC as the measurement apparatus control PC 10.

In Step S11, when the test of the reception signal is selected by operating the PC as the DUT control PC 21, the PC as the DUT control PC 21 transmits "RXTest Command" to the DUT 20.

In Step S12, the control unit 5 of the measurement apparatus 1 transmits an RF signal to the DUT 20.

In Step S13, the DUT 20 receives the RF signal from the measurement apparatus 1.

In Step S14, the DUT 20 transmits the result of receiving the RF signal to the PC as the DUT control PC 21.

Thus, in the above-described embodiment, the measurement apparatus 1 includes the 1-PPS signal generation unit 4 that generates the 1-PPS signal and outputs the 1-PPS signal to each of the measurement unit 2, the signal generation unit 3, and the DUT 20.

As a result, it is possible to perform the measurement by the measurement apparatus 1 even without using a device such as a GNSS simulator or a function generator, and thus it is possible to simplify the test configuration and reduce the cost.

The 1-PPS signal generation unit 4 includes the delay unit 43 for the measurement unit, which adjusts the delay time of the 1-PPS signal to be output to the measurement unit 2, and the delay unit 44 for the generation unit, which adjusts the delay time of the 1-PPS signal to be output to the signal generation unit 3.

This makes it possible to separately adjust the delay time of the 1-PPS signal to be output to each of the measurement unit 2 and the signal generation unit 3.

In the case of a configuration in which a 1-PPS signal is input from an external device, when it is desired to adjust the delay time of the 1-PPS signal to be output to each of the measurement unit 2 and the signal generation unit 3, it is necessary to add such a process inside the measurement apparatus 1 or to input two types of 1-PPS signals from the external device.

The 1-PPS signal generation unit 4 includes the delay unit 43 for the measurement unit, which adjusts the delay time of the 1-PPS signal to be output to the measurement unit 2, and the delay unit 44 for the generation unit, which adjusts the delay time of the 1-PPS signal to be output to the signal generation unit 3, and the output delay unit 42 that adjusts the delay time of the 1-PPS signal to be output to the DUT 20.

This makes it possible to separately adjust the delay time of the 1-PPS signal output to each of the measurement unit 2, the signal generation unit 3, and the DUT 20.

Hitherto, the embodiment of the present invention has been disclosed, but it is clear that changes can be made by those skilled in the art without departing from the scope of the present invention. All such modifications and equivalents are intended to be included in the claims as follows.

DESCRIPTION OF REFERENCE NUMERALS AND SIGNS

1 Measurement Apparatus
2 Measurement Unit
3 Signal Generation Unit
4 1 PPS Signal Generation Unit
5 Control Unit
10 Measurement Apparatus Control PC
20 DUT (Radio Communication Device)
21 DUT Control PC
41 Base Counter
42 Output Delay Unit
43 Delay Unit For Measurement Unit
44 Delay Unit For Generation Unit

What is claimed is:

1. A measurement apparatus that communicates with a radio communication device by synchronizing transmission and reception of radio signals by a common 1-PPS signal, measures the radio signal received from the radio communication device, and generates and transmits a measurement radio signal to the radio communication device, the apparatus comprising:

a 1-PPS signal generator that generates, inside the measurement apparatus, the 1-PPS signal and outputs the generated 1-PPS signal to an inside of the apparatus and the radio communication device.

2. The measurement apparatus according to claim 1, further comprising:

a signal analyzer that measures the radio signal received from the radio communication device; and a signal generator that generates the measurement radio signal, wherein the 1-PPS signal generator separately outputs the 1-PPS signal to the signal analyzer and the signal generator.

3. The measurement apparatus according to claim 2, wherein the 1-PPS signal generator is configured to include a plurality of delay elements connected in series and a selector that selects and outputs one of outputs of the plurality of delay elements so as to be able to separately adjust a delay time of the 1-PPS signal output to each of the signal analyzer, the signal generator, and the radio communication device.

* * * * *